(12) United States Patent
Chen et al.

(10) Patent No.: US 8,004,843 B2
(45) Date of Patent: Aug. 23, 2011

(54) HEAT DISSIPATION DEVICE

(75) Inventors: Chun-Chi Chen, Taipei Hsien (TW); Shi-Wen Zhou, Shenzhen (CN); Guo Chen, Shenzhen (CN)

(73) Assignees: Fu Zhun Precision Industry (Shen Zhen) Co., Ltd., Shenzhen, Guangdong Province (CN); FoxConn Technology Co., Ltd., Tu-Cheng, New Taipei (TW)

( * ) Notice: Subject to any disclaimer, the term of this patent is extended or adjusted under 35 U.S.C. 154(b) by 82 days.

(21) Appl. No.: 12/565,712

(22) Filed: Sep. 23, 2009

(65) Prior Publication Data

US 2010/0296251 A1 Nov. 25, 2010

(30) Foreign Application Priority Data

May 20, 2009 (CN) .......................... 2009 1 0302480

(51) Int. Cl.
*H05K 7/20* (2006.01)
(52) U.S. Cl. .................................. 361/700; 165/104.33
(58) Field of Classification Search .................. 361/700
See application file for complete search history.

(56) References Cited

U.S. PATENT DOCUMENTS

| | | | | |
|---|---|---|---|---|
| 5,757,621 | A * | 5/1998 | Patel | 361/719 |
| 5,932,925 | A * | 8/1999 | McIntyre | 257/719 |
| 6,356,445 | B1 * | 3/2002 | Mochzuki et al. | 361/697 |
| 7,570,490 | B2 * | 8/2009 | Refai-Ahmed et al. | 361/719 |
| 7,679,919 | B2 * | 3/2010 | Lee | 361/719 |
| 2006/0114657 | A1 * | 6/2006 | Refai-Ahmed et al. | 361/719 |
| 2006/0221576 | A1 * | 10/2006 | Takano et al. | 361/719 |
| 2009/0023647 | A1 * | 1/2009 | Stegmann et al. | 514/12 |

* cited by examiner

*Primary Examiner* — Gregory Thompson
(74) *Attorney, Agent, or Firm* — Altis Law Group, Inc.

(57) ABSTRACT

A heat dissipation device is provided for dissipating heat generated by a plurality of electronic components mounted on a printed circuit board and having different heights. The heat dissipation device includes a connecting member and a first base mounted on the connecting member and located at above one of the electronic components. A number of joining members extend through the printed circuit board and engage with the first base to assemble the first base on the one of the electronic components on the printed circuit board. A distance between the first base and the one of the electronic components is adjustable by adjusting the joining members to make the first base intimately contact with the one of the electronic components.

16 Claims, 6 Drawing Sheets

HEAT DISSIPATION DEVICE

BACKGROUND

1. Technical Field

The present disclosure relates to heat dissipation devices and, more particularly, to a heat dissipation device thermally contacting with a plurality of electronic components having different height, to dissipate heat of the electronic components, simultaneously.

2. Description of Related Art

Generally, a heat dissipation device thermally contacts with electronic components mounted on a printed circuit board (PCB) to dissipate heat of the electronic components. The heat dissipation device comprises a base contacting with the electronic components and a plurality of fins extending upwardly from a top surface of the base. When the electronic components have different heights, the base of the heat dissipation device is not able to tightly contact with all of the electronic components at the same time; as a result, a large heat resistance will exist between the electronic components and the base, which will adversely affect the heat dissipation of the electronic components.

What is needed, therefore, is a heat dissipation device which can effectively dissipate heat generated by electronic components on a printed circuit board, wherein the electronic components have different heights.

DETAILED DESCRIPTION

Figure 1:
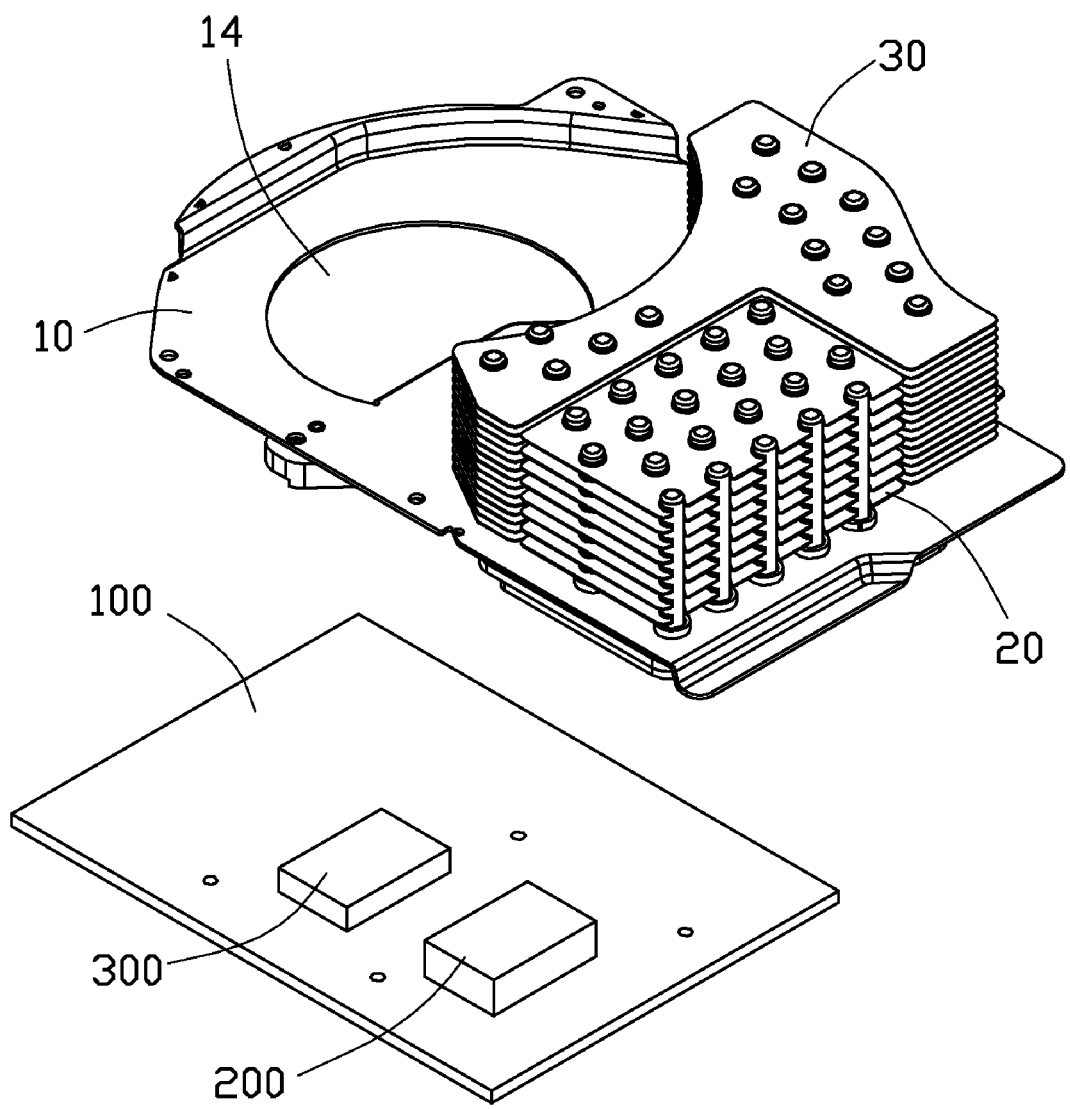
FIG. 1 is an assembly view of a heat dissipation device in accordance with an embodiment of the present disclosure and a printed circuit board separated from the heat dissipation device.
Figure 2:
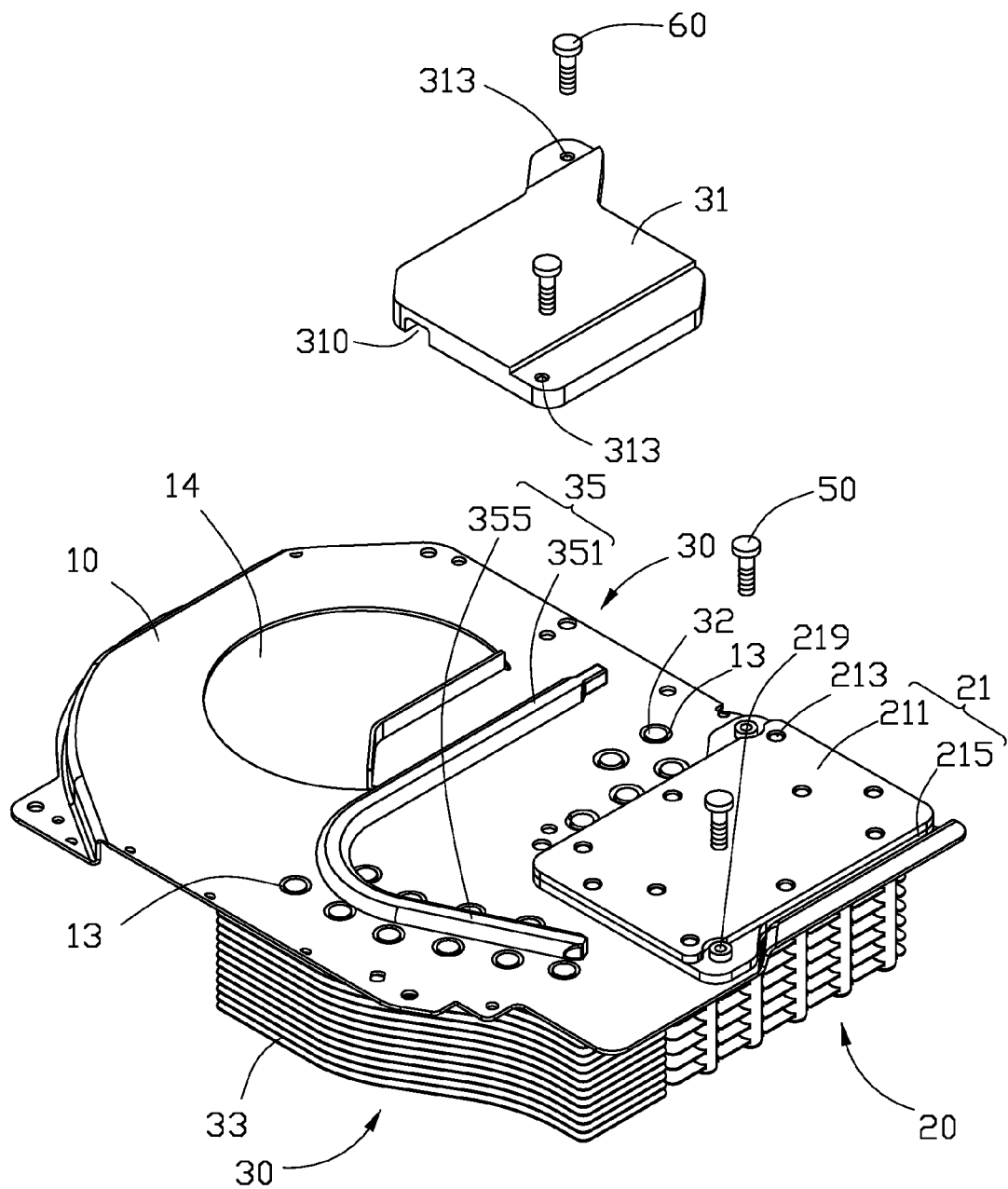
FIG. 2 is an inverted view of the heat dissipation device of FIG. 1, but a second base of a second heat sink is taken away from the second heat sink for clarity.

FIGS. 1-2 illustrate a heat dissipation device in accordance with the present disclosure. The heat dissipation device thermally contacts a first electronic component 200 and a second electronic component 300 mounted on a printed circuit board (PCB) 100 to dissipate heat generated by the first and second electronic components 200, 300 at the same time. The first electronic component 200 is higher than the second electronic component 300. The heat dissipation device comprises a connecting member 10, a first heat sink 20 and a second heat sink 30. The first and second heat sinks 20, 30 are mounted on the connecting member 10 and thermally contact the first and second electronic components 200, 300 of the PCB 100, respectively.

Figure 3:
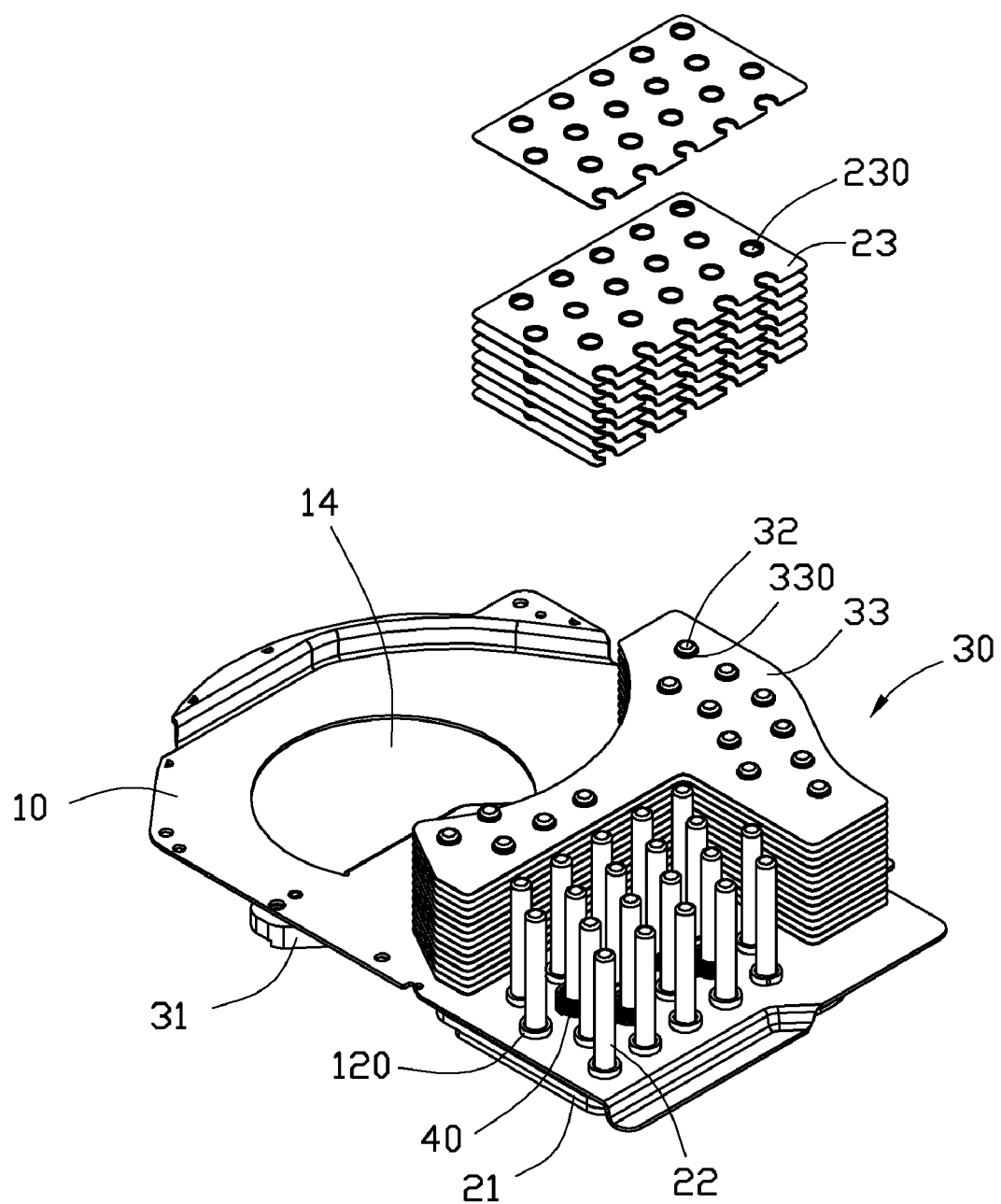
FIG. 3 is a partly exploded view of the heat dissipation device of FIG. 1, wherein first fins are separated from a first heat sink of the heat dissipation device.
Figure 4:
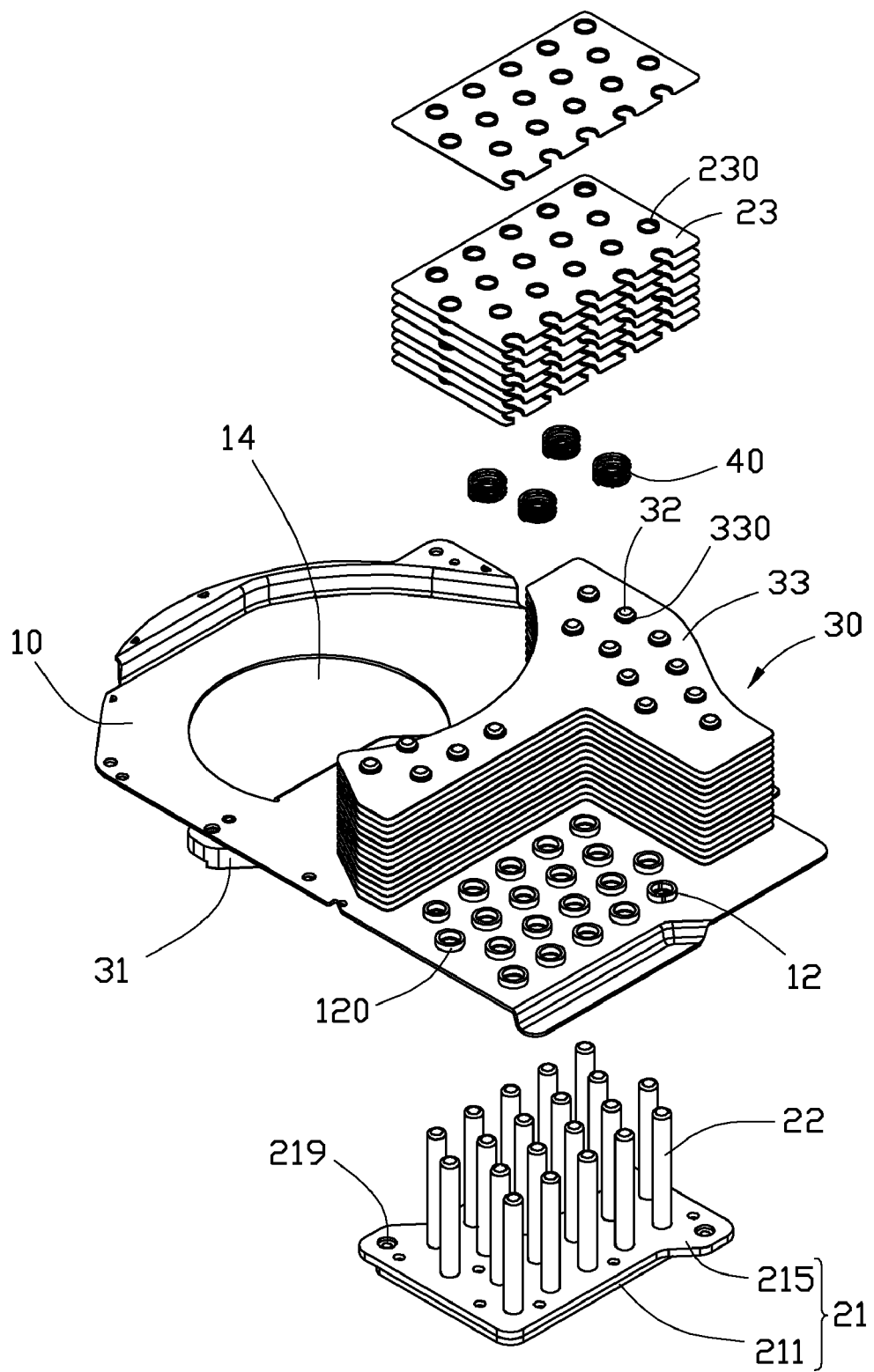
FIG. 4 is a partly exploded view of the heat dissipation device of FIG. 1, wherein the first heat sink is separated from a connecting member of the heat dissipation device.

Referring to FIGS. 3-4 also, the second heat sink 30 comprises a second base 31, a number of second pins 32, a heat pipe 35 and a number of second fins 33. The second base 31 thermally contacts the second electronic component 300 and is located at a bottom side of the connecting member 10. The second pins 32 are secured on the second base 31 and extend through second through holes 13 of the connecting member 10. The second fins 33 each have a T-shaped configuration and are parallel to and spaced from each other. A number of holes 330 are defined in each of the second fins 33. The second pins 32 extend through the holes 330 of the second fins 33 and interferentially engage with the second fins 33. Thus, the second fins 33 are secured on the second pins 32. The heat pipe 35 is L-shaped and comprises an evaporating section 351 received in a groove 310 of the second base 31, and a condensing section 355. The heat pipe 35 thermally contacts the bottom side of the connecting member 10 on which the second fins 33 are located to transfer heat to the second fins 33. Two screws 60 extend through the PCB 100 and engage in mounting holes 313 defined in two diagonally opposite ends of the second base 31 to mount the second heat sink 30 on the PCB 100. The bottom surface of the second base 31 intimately and thermally contacts the second electronic component 300.

The connecting member 10 is a metallic plate and has a rectangular configuration. A first end of the connecting member 10 defines an opening 14 to receive a fan (not shown). A second end opposite to the first end defines a number of first through holes 12. The second through holes 13 are located between the opening 14 and the first through holes 12. The first and second through holes 12, 13 are provided for assembly of the first and second heat sinks 20, 30 to the connecting member 10. The first through holes 12 are arranged in matrix and located at a corner of the second end. A flange 120 extends upwardly from an edge of the first through hole 12. The second through holes 13 are located near the opening 14.

Figure 5:
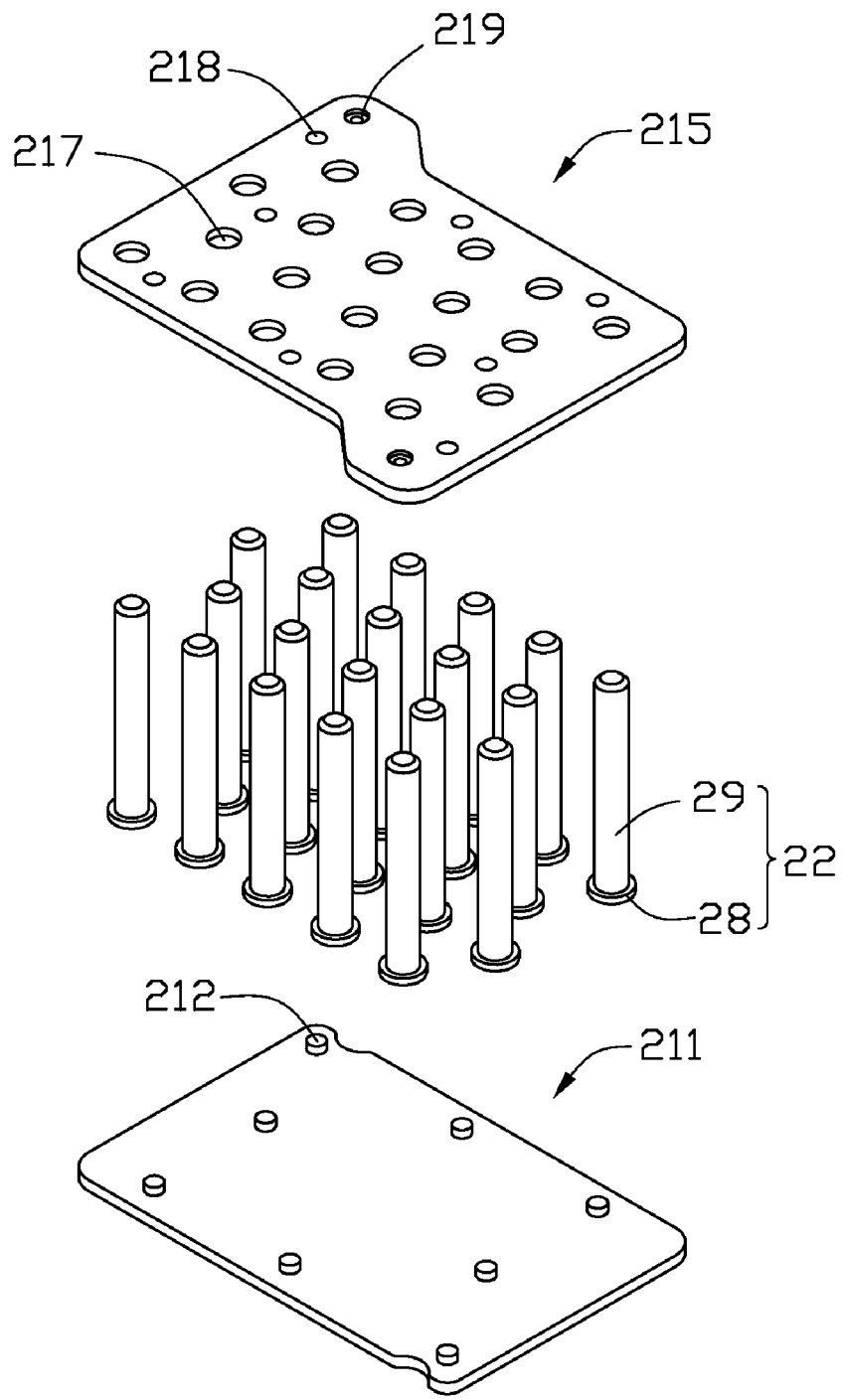
FIG. 5 is an exploded view of pins and a first base of the first heat sink of FIG. 4.
Figure 6:
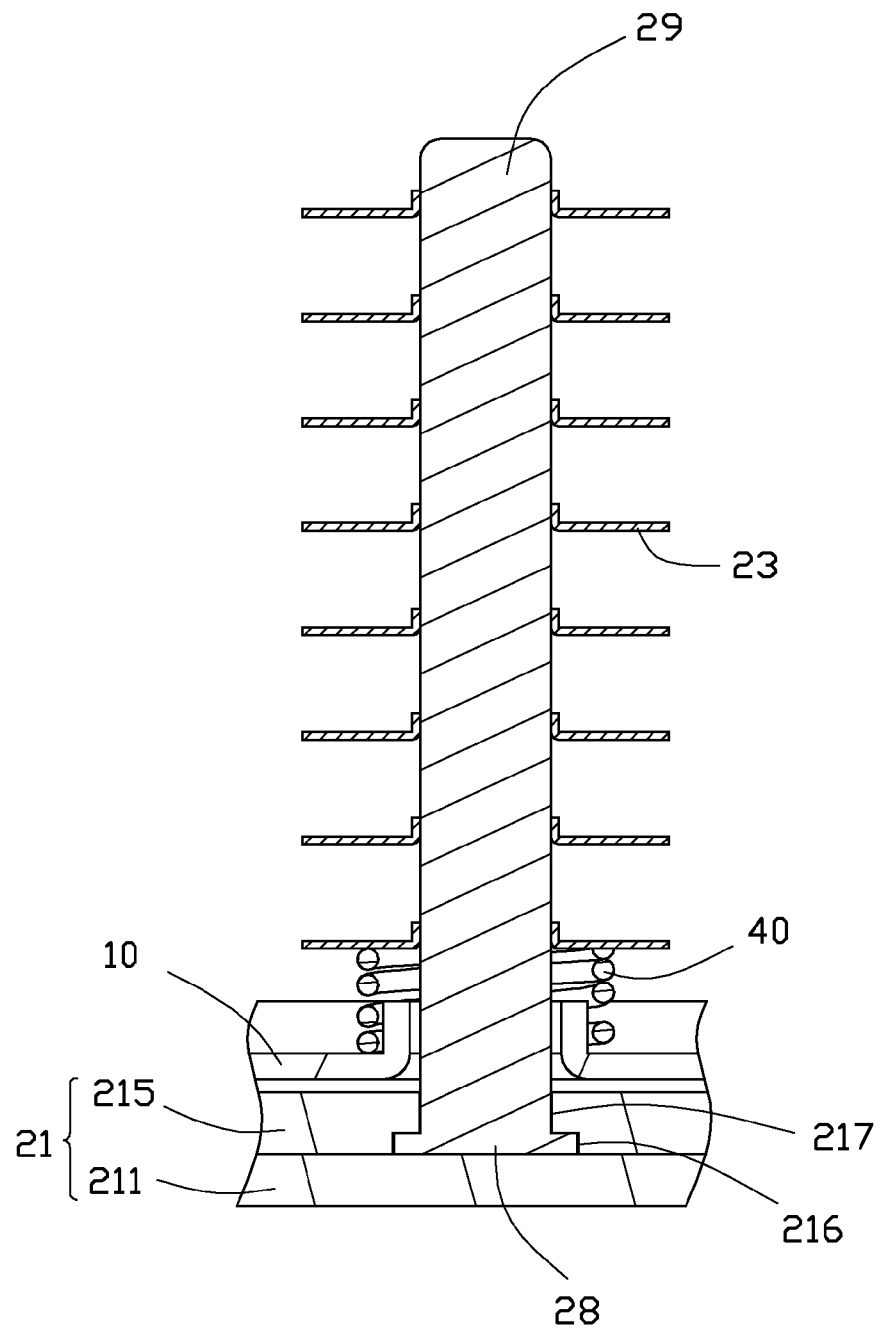
FIG. 6 is a cross-sectional view of the first heat sink, when the first heat sink is assembled to the connecting member.

Referring to FIGS. 5-6 also, the first heat sink 20 comprises a first base 21, a number of first pins 22 secured on the first base 21, a number of first fins 23 assembled on the first pins 22 and a number of elastic members 40 enclosing the first pins 22 and sandwiched between the first base 21 and the bottommost first fin 23. Each of the first base 21, the first pins 22 and the first fins 23 is made of material having good heat conductivity, such as aluminum or copper. In this embodiment, the elastic member 40 is a helical spring and can be compressed along an axial direction thereof.

The first base 21 comprises a rectangular bottom plate 211 contacting the first electronic component 200 and a top cover 215 secured on and covering the bottom plate 211. A number of columned studs 212 protrude on a top surface of the bottom plate 211 along an edge of the bottom plate 211. The studs 212 are integrally formed on the bottom plate 211 by punching. Thus, a concave 213 is defined in a bottom surface of the bottom plate 211 corresponding to each of the studs 212. The top cover 215 is a rectangular plate and defines a number of orifices 218 corresponding to the studs 212 of the bottom plate 211 to receive the studs 212. A diameter of each orifice 218 is slightly larger than that of each stud 212. A number of through holes (not labeled) are defined in the top cover 215. Each through hole has a circular recess 216 defined in a bottom of the top cover 215 and a circular passage 217 defined in a top of the top cover 215. The recess 216 and a corresponding passage 217 communicate with each other and are coaxial. The recess 216 has a diameter larger than that of the passage 217. Two sleeves 219 with internal thread extend integrally and downwardly from two diagonally opposite ends of the top cover 215. When the top cover 215 and the bottom plate 211 are assembled together, the sleeves 219 extend downwardly beyond a bottom face of the bottom plate 211. Two screws 50 extend through the PCB 100 and engage with the sleeves 219 to fix the first heat sink 20 on the PCB 100.

Each of the first pins 22 is columned and comprises a head 28 and a body 29 extending upwardly from a central portion of the head 28. Understandably the first pin 22 can be square, prism or other shape in alternative embodiments. The head 28 has a diameter larger than that of the body 29. The first pin 22 has a T-shaped profile in lengthwise cross-section (shown from FIG. 6). The head 28 has a height larger than a depth of the recess 216. The head 28 is received in the recess 216 of the top cover 215 of the first base 21 and beyond the recess 216. Preferably, the head 28 is 0.05-0.15 mm higher than the recess 21. The body 29 is slightly smaller than the passage 217 of the top cover 215. The head 28 is larger than the passage 217.

The first fins 23 are parallel to and spaced from each other. A number of holes 230 are defined in the first fins 23 to allow the bodies 29 of the first pins 22 to extend therethrough. The bodies 29 interferantially extend through the holes 230, thereby securing the first fins 23 on the bodies 29 of the first pins 22.

After the second heat sink 30 is assembled on the PCB 100, the first heat sink 20 is assembled on the PCB 100 too to thermally contact the first electronic component 200 of the PCB 100. When the first heat sink 20 is assembled, the bodies 29 of the first pins 22 extend through the passages 217 of the top cover 215 from bottom to top, and top portions of the heads 28 are received in the recesses 216 of the top cover 215. The bottom plate 211 is pressed upwardly toward the top cover 215 whereby the bottom plate 211 contacts bottom ends of the heads 28. Each of the heads 28 is pressed to deform and expand to fill a gap between the head 28 and the recess 216. In this state, a bottom surface of the head 28 is coplanar to the bottom surface of the top cover 215. Thus, the bottom plate 211 intimately contacts the bottom surface of the top cover 215 and the heads 28 of the first pins 22. Simultaneously, the studs 212 of the bottom plate 211 are received in the orifices 218 of the top cover 215. The studs 212 are punched to deform and thereby rivet into the orifices 218 and intimately joint the bottom plate 211 and top cover 215 together. In this state, the first base 21 and the first pins 22 are assembled together. The bodies 29 of the first pins 22 extend through the first holes 12 of the connecting member 10 from bottom to top. The elastic members 40 are positioned around peripheries of the flanges 120 of the connecting member 10 and abut against a top surface of the connecting member 10. The bodies 29 extend through the holes 230 of the first fins 23 and are interferentially engaged with the first fins 23. The elastic members 40 abut against the bottommost first fin 23. The bottom plate 211 of the first heat sink 20 is arranged on the first electronic component 200. Two screws 50 extend through the PCB 100 and engage with the sleeves 219 of the bottom plate 211 to fix the first heat sink 20 on the PCB 100. A distance between the bottom plate 211 and the first electronic component 200 is adjustable by tightening the screws 50. The elastic members 40 are compressed by the first base 21 and the bottommost fin 23. Thus, a force afforded by the elastic members 40 pushes the first base 21 and the connecting member 10 toward the first electronic component 200 to make the first base 21 intimately connect with the first electronic component 200.

It is to be understood, however, that even though numerous characteristics and advantages of the disclosure have been set forth in the foregoing description, together with details of the structure and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A heat dissipation device adapted for dissipating heat generated by a plurality of electronic components mounted on a printed circuit board and having different heights, the heat dissipation device comprising:
   a connecting member; and
   a first base mounted on the connecting member and located above one of the electronic components;
   wherein a number of joining members extend through the printed circuit board and engage with the first base to assemble the first base on the one of the electronic components on the printed circuit board, and a distance between the first base and the one of the electronic components is adjustable by adjusting the joining members to make the first base intimately contact the one of the electronic components; and
   wherein the first base is mounted on a bottom side of the connecting member, a first fin is located at a top side of the connecting member, an elastic member is sandwiched between the first fin and the connecting member, and the elastic member pushes the connecting member and the first base to move toward the one of the electronic components when the elastic member is compressed by tightening the joining members.

2. The heat dissipation device as claimed in claim 1, wherein each of the joining members is a screw.

3. The heat dissipation device as claimed in claim 1, wherein a number of first pins are mounted on the first base, and extend through the connecting member and the first fin to assemble the first base, the connecting member and the first fin together.

4. The heat dissipation device as claimed in claim 3, wherein the first base comprises a bottom plate having a plurality of studs protruding from a top thereof, and a top cover with a number of recesses and orifices defined therein, the bottom plate jointing with the cover by the studs riveted in the orifices.

5. The heat dissipation device as claimed in claim 4, wherein the first pin comprises a head and a body extending upwardly from the head, the head is larger than the body, the head of the first pin is sandwiched between the bottom plate and the top cover of the first base, and the body extends through the elastic member and the first fin.

6. The heat dissipation device as claimed in claim 1, wherein a second base is mounted on the bottom side of the connecting member to thermally contact another one of the electronic components mounted on the printed circuit board.

7. The heat dissipation device as claimed in claim 6, wherein a heat pipe is secured on a bottom surface of the connecting member and a portion of the heat pipe is received in a groove of the second base.

8. The heat dissipation device as claimed in claim 6, wherein a number of second pins are mounted on the second base and extend through the connecting member to engage with a second fin located at the top side of the connecting member.

9. The heat dissipation device as claimed in claim 6, wherein a number of screws extend through the printed circuit board and engage with the second base to mount the second base on the another one of the electronic components on the printed circuit board.

10. The heat dissipation device as claimed in claim 1, wherein the elastic member is a helical spring which is compressible along an axis thereof.

11. The heat dissipation device as claimed in claim 1, wherein the connecting member is a metallic plate.

12. A heat dissipation device adapted for dissipating heat generated by a first electronic component and a second electronic component mounted on a printed circuit board, the first electronic component being higher than the second electronic component, the heat dissipation device comprising:

a connecting member;

a first base mounted on a bottom side of the connecting member and located above the first electronic component, a first fin mounted on a top side of the connecting member;

a second base mounted on the connecting member and thermally contacting the second electronic component; and an elastic member sandwiched between the first fin and the connecting member;

wherein a number of joining members extend through the printed circuit board and engage with the first and second bases to assemble the first and second bases on the first and second electronic components on the printed circuit board, the joining members associated with the first base are tightened to make the elastic member compressed to push the first base towards the first electronic component, whereby the first base has an intimate thermal connection with the first electronic component.

13. The heat dissipation device as claimed in claim 12, wherein a number of first pins are mounted on the first base, and extend through the connecting member and the first fin to connect the first base, the connecting member and the first fin together.

14. The heat dissipation device as claimed in claim 12, wherein the elastic member is a helical spring which is compressible along an axis thereof.

15. The heat dissipation device as claimed in claim 12, wherein a heat pipe is secured on the bottom side of the connecting member and a portion of the heat pipe is received in a groove of the second base.

16. A heat dissipation device adapted for dissipating heat generated by a plurality of electronic components mounted on a printed circuit board and having different heights, the heat dissipation device comprising:

a connecting member;

a first base mounted on the connecting member and located above one of the electronic components; and a second base mounted on a bottom side of the connecting member to thermally contact another one of the electronic components mounted on the printed circuit board;

wherein a number of joining members extend through the printed circuit board and engage with the first base to assemble the first base on the one of the electronic components on the printed circuit board, and a distance between the first base and the one of the electronic components is adjustable by adjusting the joining members to make the first base intimately contact the one of the electronic components; and wherein a number of second pins are mounted on the second base and extend through the connecting member to engage with a second fin located at a top side of connecting member.

* * * * *